United States Patent
Su

(10) Patent No.: US 11,823,763 B2
(45) Date of Patent: Nov. 21, 2023

(54) SENSE AMPLIFIER, MEMORY AND CONTROL METHOD

(71) Applicant: CHANGXIN MEMORY TECHNOLOGIES, INC., Hefei (CN)

(72) Inventor: Hsin-Cheng Su, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 231 days.

(21) Appl. No.: 17/449,658

(22) Filed: Sep. 30, 2021

(65) Prior Publication Data

US 2022/0310133 A1 Sep. 29, 2022

Related U.S. Application Data

(63) Continuation of application No. PCT/CN2021/107679, filed on Jul. 21, 2021.

(30) Foreign Application Priority Data

Mar. 24, 2021 (CN) .......................... 202110314336.5

(51) Int. Cl.
G11C 7/00 (2006.01)
G11C 7/08 (2006.01)
(Continued)

(52) U.S. Cl.
CPC ................ *G11C 7/08* (2013.01); *G11C 7/062* (2013.01); *G11C 7/1096* (2013.01); *G11C 7/12* (2013.01)

(58) Field of Classification Search
CPC ....... G11C 7/1078; G11C 7/22; G11C 7/1006; G11C 7/1072; G11C 7/1096
(Continued)

(56) References Cited

U.S. PATENT DOCUMENTS 5,526,313 A 6/1996 Etoh et al.
5,659,260 A 8/1997 Kajimoto et al.
(Continued)

FOREIGN PATENT DOCUMENTS

CN 1496568 A 5/2004
CN 101140798 A 3/2008
(Continued)

OTHER PUBLICATIONS

Rahul Sarpeshkar et al.: Mismatch Sensitivity of a Simultaneously Latched CMOS Sense Amplifier, IEEE Journal of Solid-State Circuits, vol. 26, No. 10, Oct. 1991.
(Continued)

*Primary Examiner* — Son T Dinh
(74) *Attorney, Agent, or Firm* — SYNCODA LLC; Feng Ma

(57) ABSTRACT

A sense amplifier includes: an amplification module, configured to amplify a voltage difference between a bit line and a reference bit line when the sense amplifier is in an amplification phase; a controllable power module, connected to the amplification module and configured to supply a first voltage to the amplification module when the sense amplifier is in a writing phase, and supply a second voltage to the amplification module when the sense amplifier is in a non-writing phase, and the second voltage is greater than the first voltage; and a writing module, connected to the bit line and the reference bit line and configured to pull the voltage difference between the bit line and the reference bit line according to to-be-written data when the sense amplifier is in the writing phase.

20 Claims, 8 Drawing Sheets

(51) Int. Cl.
*G11C 7/06* (2006.01)
*G11C 7/10* (2006.01)
*G11C 7/12* (2006.01)

(58) Field of Classification Search
USPC .............................. 365/189.16, 189.14, 206
See application file for complete search history.

(56) References Cited

U.S. PATENT DOCUMENTS

| | | | |
|---|---|---|---|
| 6,147,916 A | 11/2000 | Ogura | |
| 7,663,953 B2 | 2/2010 | Cheng et al. | |
| 10,388,355 B1 | 8/2019 | Ware et al. | |
| 2003/0103374 A1* | 6/2003 | Sakai | G11C 11/22 365/145 |
| 2007/0076501 A1 | 4/2007 | Kang et al. | |
| 2011/0205812 A1 | 8/2011 | Kajigaya | |
| 2012/0081986 A1 | 4/2012 | Joo et al. | |
| 2016/0012868 A1 | 1/2016 | Moon et al. | |
| 2021/0005243 A1 | 1/2021 | Bae | |

FOREIGN PATENT DOCUMENTS

| | | |
|---|---|---|
| CN | 102394094 A | 3/2012 |
| CN | 101562042 B | 6/2012 |
| CN | 102881318 A | 1/2013 |
| CN | 103021455 A | 4/2013 |
| CN | 103123808 A | 5/2013 |
| CN | 103594111 A | 2/2014 |
| CN | 105976859 A | 9/2016 |
| CN | 106205676 A | 12/2016 |
| CN | 109712651 A | 5/2019 |
| CN | 111739565 A | 10/2020 |
| CN | 111863049 A | 10/2020 |
| CN | 111863052 A | 10/2020 |
| CN | 111863053 A | 10/2020 |
| CN | 111863055 A | 10/2020 |
| CN | 112447208 A | 3/2021 |
| CN | 112992200 A | 6/2021 |
| CN | 112992201 A | 6/2021 |
| CN | 112992202 A | 6/2021 |
| CN | 112992203 A | 6/2021 |
| CN | 112992292 A | 6/2021 |
| CN | 113012729 A | 6/2021 |
| JP | S58102389 A | 6/1983 |
| KR | 20040003210 A | 1/2004 |
| TW | M358390 U | 6/2009 |
| WO | 2021036104 A1 | 3/2021 |

OTHER PUBLICATIONS

The CN priority application first search report in Application No. 2021103143473, Date of filling: Mar. 24, 2021.
International Search Report in Application No. PCT/CN2021/107679, dated Dec. 16, 2021.

* cited by examiner

SENSE AMPLIFIER, MEMORY AND CONTROL METHOD

CROSS-REFERENCE TO RELATED APPLICATIONS

This is a continuation of International Application No. PCT/CN2021/107679 filed on Jul. 21, 2021, which claims priority to Chinese Patent Application No. 202110314336.5 filed on Mar. 24, 2021. The disclosures of these applications are hereby incorporated by reference in their entirety.

BACKGROUND

With the popularization of electronic devices such as mobile phones, tablets and personal computers, semiconductor memory technology has also been developed rapidly.

SUMMARY

The present disclosure relates to, but is not limited to, a sense amplifier, a memory, and a control method.

Some embodiments of the present disclosure provide a sense amplifier, and the sense amplifier includes an amplification module, a controllable power module and a writing module, and the amplification module is configured to amplify a voltage difference between a bit line and a reference bit line when the sense amplifier is in an amplification phase; the controllable power module is connected to the amplification module and configured to supply a first voltage to the amplification module when the sense amplifier is in a writing phase, and supply a second voltage to the amplification module when the sense amplifier is in a non-writing phase, and the second voltage is greater than the first voltage; the writing module is connected to the bit line and the reference bit line and configured to pull the voltage difference between the bit line and the reference bit line according to to-be-written data when the sense amplifier is in the writing phase.

Some embodiments of the present disclosure further provide a memory, the memory includes the sense amplifier involved in the described embodiment and memory cells; and a plurality of memory cells constitute a first memory array and a plurality of memory cells constitute a second memory array, the sense amplifier is located between the first memory array and the second memory array, a third end of the sense amplifier is connected to a bit line of the first memory array, and a fourth end of the sense amplifier is connected to a bit line of the second memory array.

Some embodiments of the present disclosure further provide a control method for a sense amplifier, the sense amplifier includes an amplification module, a controllable power module, and a writing module, the method includes: a working state of the amplification module is acquired, and the working state includes a writing phase and a non-writing phase; a control signal for controlling the controllable power module is generated according to the working state, so that the controllable power module supplies a first voltage to the amplification module in the writing phase, and supplies a second voltage to the amplification module in the non-writing phase, and the second voltage is higher than the first voltage.

DETAILED DESCRIPTION

In order to make objects, technical solutions and advantages of some embodiments of the present disclosure clearer, hereinafter, the technical solutions in some embodiments of the present disclosure will be described clearly and completely in combination with the drawings in some embodiments of the present disclosure. Obviously, the embodiments as described are only parts of embodiments rather than all the embodiments of the present disclosure. On the basis of some embodiments of the present disclosure, all other embodiments obtained by a person of ordinary skill in the art without inventive effort all belong to the scope of protection of the present disclosure.

A sense amplifier (SA) is an important constituent part of a semiconductor memory, and mainly functions to amplify small signals on a bit line, so as to perform reading or writing operations. The sense amplifier includes a write circuit and an amplification circuit. When data is written to a memory cell, both the write circuit and the amplification circuit pull the voltage of the bit line and the voltage of a reference bit line.

However, if the drive capability of the write circuit is weaker than that of the amplification circuit, the write circuit cannot pull the voltage of the bit line and the voltage of the reference bit line according to to-be-written data, so that the sense amplifier cannot be inverted, resulting in failure of writing of the data.

Figure 1:
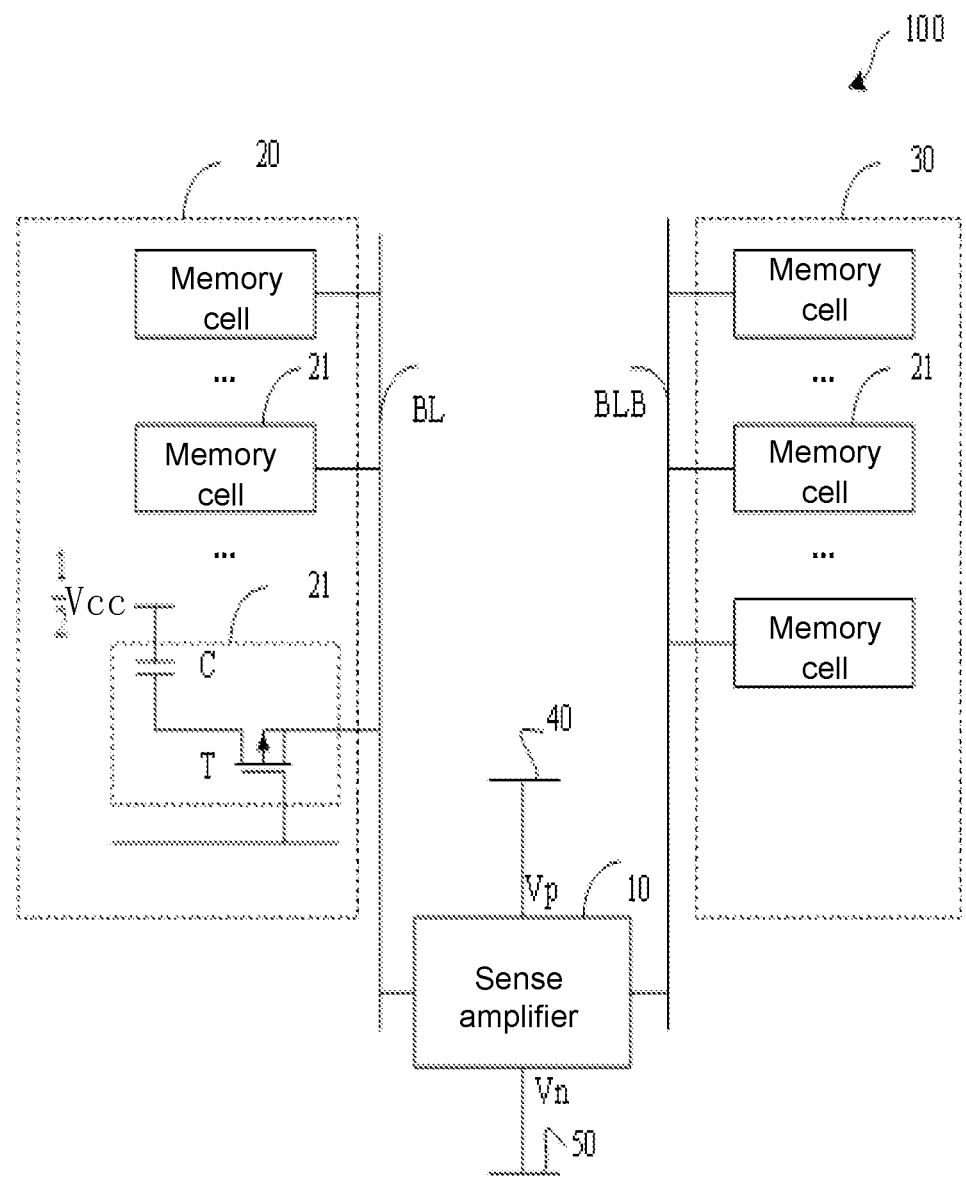
FIG. 1 is a schematic diagram of the structure of a memory provided according to some embodiments of the present disclosure.

As shown in FIG. 1, some embodiments of the present disclosure provide a memory 100, the memory 100 includes a sense amplifier 10 and memory cells 21. A plurality of memory cells 21 constitute a first memory array 20, and a plurality of memory cells 21 constitute a second memory array 30. Each of the plurality of memory cells 21 in the first memory array 20 is connected to a bit line BL of the first memory array 20, and each of the plurality of memory cells 21 in the second memory array 30 is connected to a bit line BL of the second memory array 30.

The sense amplifier 10 is located between the first memory array 20 and the second memory array 30; and a first end Vp of the sense amplifier 10 is configured to connect to a first power supply 40, a second end Vn of the sense amplifier 10 is also configured to connect to a second power supply 50, a third end of the sense amplifier 10 is connected to the bit line BL of the first memory array 20, and a fourth end of the sense amplifier 10 is connected to the bit line BL of the second memory array 30.

Each of the plurality of memory cells 21 is configured to store one bit of data, the bit line BL of the first memory array 20 is configured to access data stored in the plurality of memory cells 21 of the first memory array 20, and the bit line BL of the second memory array 30 is configured to access data stored in the plurality of memory cells 21 of the second memory array 30. The sense amplifier 10 is configured to amplify the data stored in each of the plurality of memory cells 21, and present on the bit line BL of the first memory array 20 and the bit line BL of the second memory array 30. The sense amplifier 10 is further configured to recover the memory cells 21 to a state before the read operation after a data read operation is completed.

Each of the plurality of memory cells 21 includes a storage capacitor C and an access transistor T; a first end of the storage capacitor C is connected to a charging power supply $0.5V_{CC}$, a second end of the storage capacitor C is connected to a first end of the access transistor T, a second end of the access transistor T is connected to the bit line BL, and a control end of the access transistor T is connected to a word line.

Logic 1 and 0 are represented by large and small of charges stored in the storage capacitor C or high and low of voltage difference between two ends of the storage capacitor C. The access transistor T is configured to control whether to permit or prohibit reading or rewriting of information stored in the storage capacitor C.

For convenience of description, when data is written into a certain memory cell 21 in the first memory array 20, the bit line of the first memory array 20 is referred to as a bit line BL, and the bit line of the second memory array 30 is referred to as a reference bit line BLB; and when data is written into a certain memory cell 21 in the second memory array 30, the bit line of the second memory array 30 is referred to as a bit line BL, and the bit line of the first memory array 20 is referred to as a reference bit line BLB.

Generally, the sense amplifier is internally provided with a write circuit and an amplification circuit, and voltages of the bit line BL and the reference bit line BLB are pulled by the write circuit, and then the bit line BL charges the storage capacitors in the memory cells, or the storage capacitors discharge to the bit line BL, thereby achieving data writing.

Figure 2:
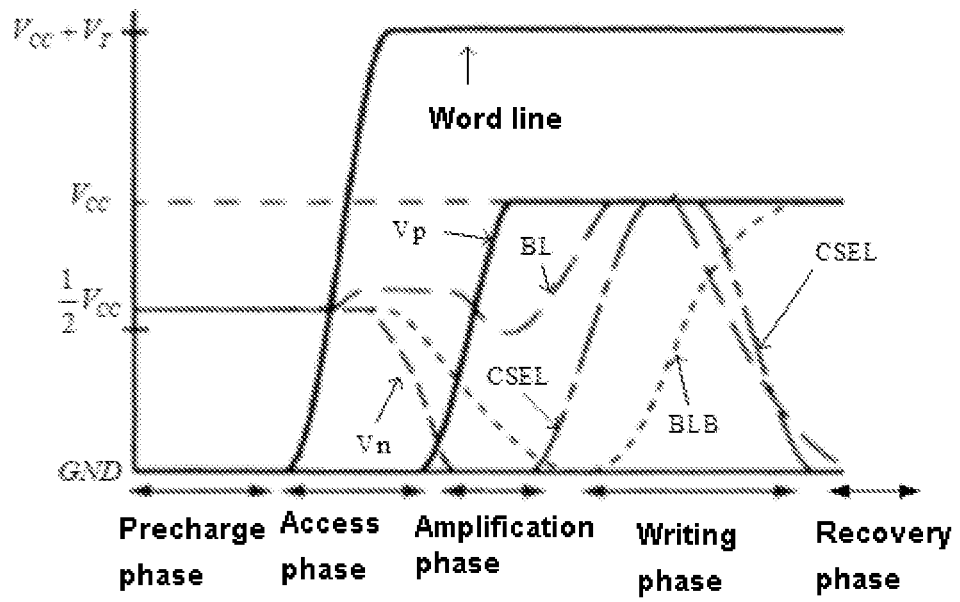
FIG. 2 is a sequence diagram when writing data provided according to some other embodiments of the present disclosure.

Hereinafter, the process in which the sense amplifier writes data "0" into one of the plurality of memory cells 21 of the first memory array 20 is described in conjunction with FIG. 2. The process of writing of data includes a precharge phase, an access phase, an amplification phase, a writing phase, and a recovery phase.

In the precharge phase, the charging power supply pulls up both a voltage of the bit line BL of the first memory array 20 and a voltage of the reference bit line BLB to a charging voltage of $0.5V_{CC}$.

In the access phase, a signal in a word line corresponding to an accessed memory cell 21 is controlled, so that an access transistor T in the accessed memory cell 21 is turned on, and the storage capacitor C changes the voltage of the bit line BL, for example: if data stored in the storage capacitor C is "1", the storage capacitor C increases the voltage of the bit line BL.

In the amplification phase, the voltage of the bit line BL is higher than a reference voltage, and the amplification circuit pulls up the voltage of the bit line BL and pulls down the voltage of the reference bit line BLB, so as to amplify a voltage difference between the bit line BL and the reference bit line.

In the writing phase, a column selection signal is controlled, and the voltage of the reference bit line BLB is pulled by the write circuit according to a voltage corresponding to logic data "0", that is, the voltage of the reference bit line BLB is pulled up, and the voltage of the bit line BL is pulled down, so that the voltage of the bit line BL is lower than the voltage of the reference bit line BLB.

In the recovery phase, the sense amplifier 10 stabilizes the voltage of the bit line BL and the voltage of the reference bit line BLB at the logic data "0", the bit line BL also charges the storage capacitor C (when the bit line BL is "1", current flows from the bit line BL to the storage capacitor C, and when the bit line BL is "0", current flows from the storage capacitor C to the bit line BL, and the charging herein represents the two current directions above), and after a certain time of charging, the data "0" is written into the storage capacitor C. Then, the access transistor is turned off by controlling a signal in the word line, and the writing of the logic data "0" is completed.

It should be noted that the process of writing data into the memory cell only includes the precharge phase, the writing phase and the recovery phase in some other embodiments, which is not limited herein.

However, in the process of writing data into the memory cell 21, both the write circuit and the amplification circuit pull the voltage of the bit line BL and the voltage of the reference bit line BLB. If drive capability of the write circuit is weaker than that of the amplification circuit, the write circuit cannot pull the voltage of the bit line BL and the voltage of the reference bit line BLB according to to-be-written data, so that the sense amplifier cannot be inverted, resulting in failure of writing of the data.

Figure 3:
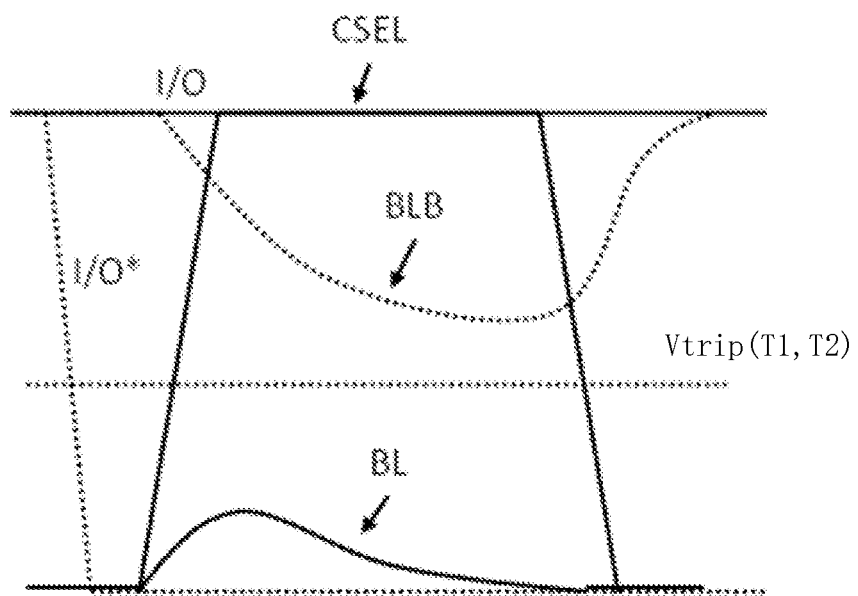
FIG. 3 is a schematic diagram illustrating the principle of failure of data writing when the drive capability of a writing module is weak.

For example, as shown in FIG. 3, when write circuits I/O and I/O* are used to write logic data "1" into the memory cell, after the column selection signal is enabled, a voltage drop of the reference bit line BLB is insufficient, cannot reach an inversion point voltage Vtrip (T1, T2) of an inverter formed by an N-type transistor and a P-type transistor in the amplification circuit, and cannot form positive feedback to invert the sense amplifier, and thus the to-be-written data cannot be stably presented on the bit line BL and the reference bit line BLB, thereby causing failure of writing.

In order to solve the described technical problem, some embodiments of the present disclosure provide a sense amplifier, a memory and a control method, which aim at ensuring that data can also be successfully written into a memory cell even in cases where drive capability of a write circuit is weak. The technical concept of some embodiments of the present disclosure is: in a writing phase of the sense amplifier, a controllable power module supplies a first voltage to an amplification module; and in a non-writing phase of the sense amplifier, the controllable power module supplies a second voltage to the amplification module. Compared with the non-writing phase, capability of the amplification module pulling a voltage of a bit line and a voltage of a reference bit line in the writing phase is weakened, so that in cases where the drive capability of the writing module is weak, the voltage of the bit line and the voltage of the reference bit line can also be pulled in the writing phase, thereby ensuring that data can also be successfully written into the memory cell in cases where the drive capability of the writing module is weak.

Figure 4:
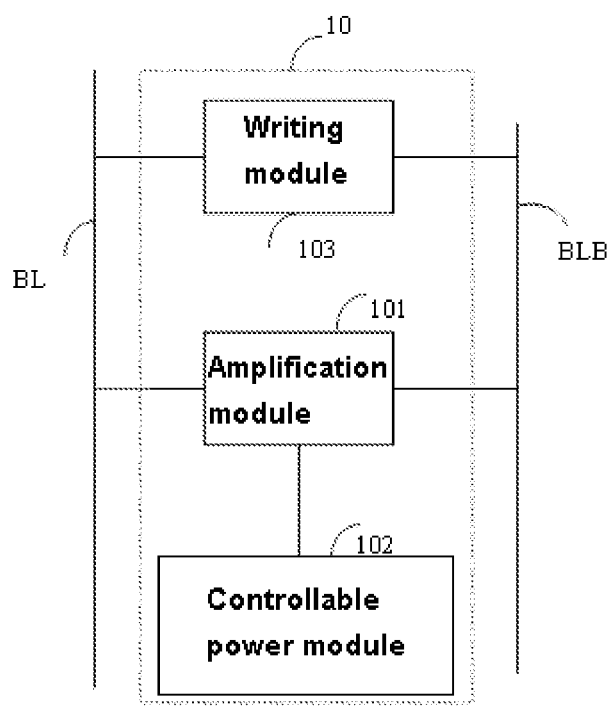
FIG. 4 is a circuit structure diagram of a sense amplifier provided according to some other embodiments of the present disclosure.

As shown in FIG. 4, some embodiments of the present disclosure provide a sense amplifier 10, the sense amplifier 10 includes an amplification module 101, a controllable power module 102 and a writing module 103. The amplification module 101 is connected to the controllable power module 102, the amplification module 101 is connected to a bit line BL, the amplification module 101 is also connected to a reference bit line BLB, the writing module 103 is connected to the bit line BL, and the writing module 103 is further connected to the reference bit line BLB.

The amplification module 101 is configured to amplify a voltage difference between the bit line BL and the reference bit line BLB when the sense amplifier 10 is in an amplification phase. The controllable power module 102 is configured to supply a first voltage to the amplification module 101 when the sense amplifier 10 is in a writing phase. The controllable power module 102 is configured to supply a second voltage to the amplification module when the sense amplifier 10 is in a non-writing phase. The first voltage is smaller than the second voltage. The writing module 103 is configured to pull the voltage difference between the bit line BL and the reference bit line BLB according to to-be-written data when the sense amplifier 10 is in the writing phase.

When the sense amplifier 10 is in the writing phase, the controllable power module 102 supplies a low voltage to the amplification module 101, so as to weaken effect of the amplification module 101 on a voltage of the bit line BL and a voltage of the reference bit line BLB in the writing phase. At this time, the writing module 103 pulls the voltage of the bit line BL and the voltage of the reference bit line BLB according to the to-be-written data. If writing data is logic data "1", the voltage of the bit line BL is pulled up, and the voltage of the reference bit line BLB is pulled down; and if the writing data is logic data "0", the voltage of the bit line BL is pulled down, and the voltage of the reference bit line BLB is pulled up. The effect of the amplification module 101 on the voltage of the bit line BL and the voltage of the reference bit line BLB in the writing phase is weakened, and thus in cases where drive capability of the writing module 103 is lower than that of the amplification module 101, the voltage of the bit line BL and the voltage of the reference bit line BLB can also be pulled, and the to-be-written data is presented on the bit line BL and the reference bit line BLB. In a recovery phase, the controllable power module 102 is controlled to supply a second voltage to the amplification module 101, the amplification module amplifies the voltage difference between the bit line BL and the reference bit line BLB, and stably presents the to-be-written data on the bit line BL and the reference bit line BLB; and then an access transistor T in a memory cell 21 is controlled, so that charging and discharging between a storage capacitor C in the memory cell 21 and the bit line BL are achieved, and the to-be-written data is written into the memory cell.

In the described technical solution, a voltage supplied by the controllable power module to the amplification module in the writing phase is lower than that in the non-writing phase, and capability of the amplification module in pulling the voltage of the bit line and the voltage of the reference bit line in the writing phase is weakened, so as to strengthen capability of the writing module in pulling the voltage of the bit line and the voltage of the reference bit line in the writing phase, so that the to-be-written data can also be successfully presented on the bit line and the reference bit line in cases where the drive capability of the writing module is weak, and then the data can be successfully written into the memory cell.

Figure 5:
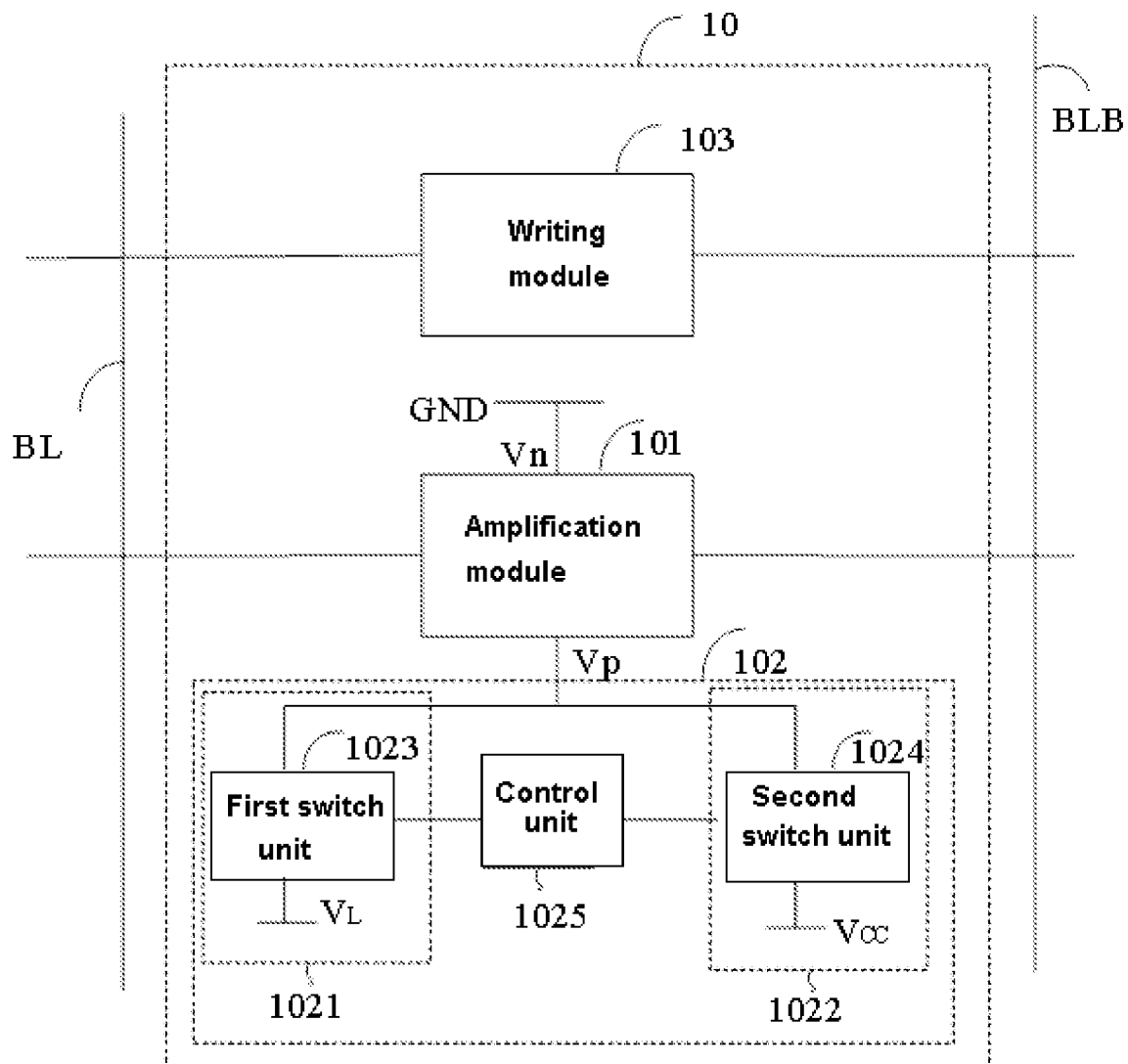
FIG. 5 is a circuit structure diagram of a sense amplifier provided according to some other embodiments of the present disclosure.

As shown in FIG. 5, some other embodiments of the present disclosure provide a sense amplifier 10, the sense amplifier 10 includes an amplification module 101, a controllable power module 102 and a writing module 103. The amplification module 101 is connected to the controllable power module 102, the amplification module 101 is connected to a bit line BL, the amplification module 101 is also connected to a reference bit line BLB, the writing module 103 is connected to the bit line BL, and the writing module 103 is further connected to the reference bit line BLB.

The controllable power module 102 includes a first controllable power unit 1021, a second controllable power unit 1022, and a control unit 1025. An output end of the first controllable power unit 1021 is connected to a first end of the amplification module 101, an output end of the second controllable power unit 1022 is also connected to the first end of the amplification module 101, the control unit 1025 is connected to a control end of the first controllable power unit 1021, and the control unit 1025 is also connected to a control end of the second controllable power unit 1022. A second end of the amplification module 101 is grounded GND, a third end of the amplification module 101 is connected to a bit line BL of a first memory array, and a fourth end of the amplification module 101 is connected to a bit line BL of a second memory array.

The first controllable power unit 1021 is configured to supply a first voltage to the amplification module 101, and the second controllable power unit 1022 is configured to supply a second voltage to the amplification module 101. The control unit 1025 is configured to control, in a writing phase, the first controllable power unit 1021 to supply the first voltage to the amplification module 101, and is further configured to control, in a non-writing phase, the second controllable power unit to supply the second voltage to the amplification module. The first voltage is lower than the second voltage, so that capability of the amplification module in pulling the voltage of the bit line BL and the voltage of the reference bit line BLB in the writing phase is reduced. At this time, the writing module 103 pulls the voltage of the bit line BL and the voltage of the reference bit line BLB according to to-be-written data, so as to ensure that the voltage of the bit line BL and the voltage of the reference bit line BLB are also pulled when drive capability of the writing module 103 is weak. In a recovery phase, the second voltage is supplied to the amplification module, and the capability of the amplification module in pulling the voltage of the bit line BL and the voltage of the reference bit line BLB is recovered, so that the amplification module 101 can continue to pull the voltage of the bit line BL and the voltage of the reference bit line BLB in the recovery phase, so as to stably present the to-be-written data on the bit line BL and the reference bit line BLB.

In some other embodiments, the first controllable power unit 1021 includes a first switch unit 1023, and the second controllable power unit 1022 includes a second switch unit 1024.

The first switch unit 1023 is provided with a first end, a second end and a control end, the first end of the first switch unit 1023 is connected to a first power supply end $V_L$, the second end of the first switch unit 1023 is connected to a first end Vp of the amplification module, and the control end of the first switch unit 1023 is connected to a first output end of the control unit 1025.

The second switch unit 1024 is provided with a first end, a second end and a control end, the first end of the second switch unit 1024 is connected to a second power supply end Vcc, the second end of the second switch unit 1024 is connected to the first end Vp of the amplification module 101, and the control end of the second switch unit 1024 is connected to a second output end of the control unit 1025. A voltage supplied by the first power supply end $V_L$ is lower than a voltage supplied by the second power supply end Vcc.

When the sense amplifier 10 is in the writing phase, the control unit 1025 controls the first switch unit 1023 to be closed, the first power supply end $V_L$ supplies the first voltage to the amplification module 101, and the capability of the amplification module 101 in pulling the voltage of the bit line BL and the voltage of the reference bit line BLB is reduced. When the sense amplifier 10 is in the non-writing phase, the control unit 1025 controls the second switch unit 1023 to be closed, the second power supply end Vcc supplies the second voltage to the amplification module 101, and the capability of the amplification module 101 in pulling the voltage of the bit line BL and the voltage of the reference bit line BLB is recovered.

Hereinafter, a process in which the sense amplifier writes data "1" into one of memory cells 21 of the first memory array 20 is described. The process of writing data includes a precharge phase, an access phase, an amplification phase, a writing phase, and a recovery phase. Assume that before writing, "0" is stored in the memory cell 21.

In the precharge phase, a switch between a charging power supply and the bit line BL and a switch between the charging power supply and the reference bit line BLB is closed, and the voltage of the bit line BL of the first memory array 20 and the voltage of the reference bit line BLB are pulled to $0.5V_{CC}$ by the charging power supply.

In the access phase, the second switch unit 1024 is closed, the first switch unit 1023 is opened, and the second power supply end Vcc supplies the second voltage to the amplification module 101. In addition, a signal in a word line corresponding to an accessed memory cell 21 is controlled, so that an access transistor T in the accessed memory cell 21 is turned on, and a storage capacitor C changes the voltage of the bit line BL, for example: if data stored in the storage capacitor C is "0", the storage capacitor C decreases the voltage of the bit line BL, that is, the bit line BL charges the storage capacitor C, and current flows from the bit line BL to the storage capacitor C.

In the amplification phase, the second switch unit 1024 is closed, the first switch unit 1023 is opened, and the second power supply end Vcc supplies the second voltage to the amplification module 101. The amplification module 101 has strong capability of pulling the voltage of the bit line BL and the voltage of the reference bit line BLB, and the voltage of the bit line BL is less than a reference voltage, the amplification module 101 pulls up the voltage of the reference bit line BLB and pulls down the voltage of the bit line BL, so as to amplify a voltage difference between the bit line BL and the reference bit line BLB.

In the writing phase, the first switch unit 1023 is closed, the second switch unit 1024 is opened, and the first power supply end $V_L$ supplies the first voltage to the amplification module 101, so as to weaken the capability of the amplification module 101 in pulling the voltage of the bit line BL and the voltage of the reference bit line BLB. In addition, a column selection signal is controlled, a write circuit pulls the voltage of the bit line BL and the voltage of the reference bit line BLB according to a voltage corresponding to logic data "1", that is, the voltage of the bit line BL is pulled up, and the voltage of the reference bit line BLB is pulled down, so that the voltage of the bit line BL is higher than the voltage of the reference bit line BLB.

In the recovery phase, the second switch unit 1024 is closed, the first switch unit 1024 is opened, and the second power supply end Vcc supplies the second voltage to the amplification module 101, so as to recover an effect of the amplification module in the voltage of the bit line BL and the voltage of the reference bit line BLB. The amplification module 101 amplifies the voltage difference between the bit line BL and the reference bit line BLB, and stabilizes the voltage difference at the logic data "1"; the bit line BL also charges the storage capacitor C, and after a certain time of charging, data "1" is written into the storage capacitor C. Then, the access transistor is turned off by controlling a signal in the word line, and the writing of the logic data "1" is completed.

In the described technical solution, the control unit controls the closing or opening of the two switch units, so as to control a power supply end supplying power to the amplification module; the first power supply end supplies the first voltage to the amplification module in the writing phase, so as to weaken the capability of the amplification module in pulling the voltage of the bit line and the voltage of the reference bit line, thereby ensuring that the voltage of the bit line and the voltage of the reference bit line can also be pulled according to the to-be-written data when the drive capability of the writing module is weak, so as to write the to-be-written data into the memory cell.

Figure 6:
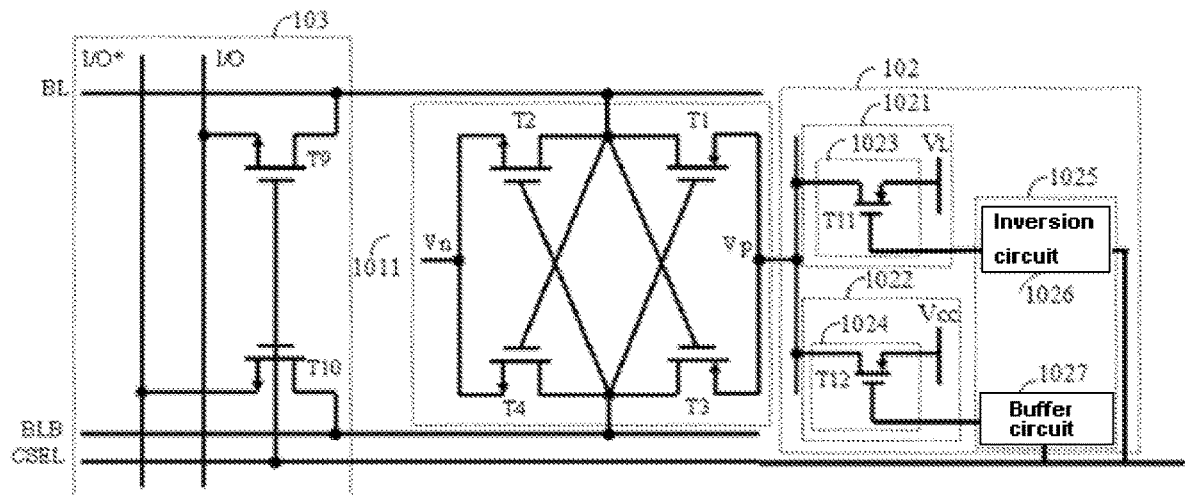
FIG. 6 is a circuit structure diagram of a sense amplifier provided according to some other embodiments of the present disclosure.

As shown in FIG. 6, some other embodiments of the present disclosure provide a sense amplifier, the sense amplifier includes an amplification module 101, a controllable power module 102 and a writing module 103. The amplification module 101 is connected to the controllable power module 102, the amplification module 101 is connected to a bit line BL, the amplification module 101 is also connected to a reference bit line BLB, the writing module 103 is connected to the bit line BL, and the writing module 103 is further connected to the reference bit line BLB.

The amplification module 101 includes at least one cross-coupled amplification circuit 1011, each of the at least one cross-coupled amplification circuit 1011 is provided with a first end Vp, a second end Vn, a third end and a fourth end. The first end Vp of the cross-coupled amplification circuit 1011 is connected to an output end of the controllable power module 102, the second end Vn of the cross-coupled amplification circuit 1011 is grounded, the third end of the cross-coupled amplification circuit 1011 is connected to the bit line BL, and the fourth end of the cross-coupled amplification circuit is connected to the reference bit line BLB.

The cross-coupled amplification circuit 1011 includes: a first transistor T1, a second transistor T2, a third transistor T3 and a fourth transistor T4.

A first end of the first transistor T1 is the first end Vp of the cross-coupled amplification circuit 1011, a second end of the second transistor T2 is the second end Vn of the cross-coupled amplification circuit 1011, a second end of the first transistor T1 is the third end of the cross-coupled amplification circuit 1011, and a second end of the third transistor T3 is the fourth end of the cross-coupled amplification circuit 1011.

The second end of the first transistor T1 is connected to a first end of the second transistor T2, the second end of the third transistor T3 is connected to a first end of the fourth transistor T4, the first end of the first transistor T1 is connected to a first end of the third transistor T3, and the second end of the second transistor T2 is connected to a second end of the fourth transistor T4.

A control end of the first transistor T1 is connected to the second end of the third transistor T3, and a control end of the second transistor T2 is connected to the second end of the third transistor T3; and a control end of the third transistor T3 is connected to the second end of the first transistor T1, and a control end of the fourth transistor T4 is connected to the second end of the first transistor T1.

The controllable power module 102 includes a first controllable power unit 1021 and a second controllable power unit 1022. An output end of the first controllable power unit 1021 is connected to a first end of the amplification module 101, an output end of the second controllable power unit 1022 is also connected to the first end of the amplification module 101, a control unit 1025 is connected to a control end of the first controllable power unit 1021, and the control unit 1025 is also connected to a control end of the second controllable power unit 1022.

The first controllable power unit 1021 includes a first switch unit 1023, and the second controllable power unit 1022 includes a second switch unit 1024. The first switch unit 1023 is an eleventh transistor T11, and the second switch unit 1024 is a twelfth transistor T12.

The control unit 1025 includes an inversion circuit 1026 and a buffer circuit 1027. An input end of the inversion circuit 1026 is connected to a column selection line, and an input end of the buffer circuit 1027 is connected to the column selection line.

A first end of the eleventh transistor T11 is connected to a first power supply end $V_L$, a second end of the eleventh transistor T11 is connected to the first end Vp of the cross-coupled circuit 1011, and a control end of the eleventh transistor T11 is connected to a first output end of the inversion circuit 1027.

A first end of the twelfth transistor T12 is connected to a second power supply end Vcc, a second end of the twelfth transistor T12 is connected to the first end Vp of the cross-coupled circuit 1011, and a control end of the twelfth transistor T12 is connected to an output end of the buffer circuit.

The inversion circuit 1026 is configured to perform inversion processing on a column selection signal and then obtain a first control signal for controlling the first switch unit. The buffer circuit 1027 is configured to perform buffer processing on the column selection signal and then obtain a second control signal for controlling the second switch unit.

The writing module 103 includes a ninth transistor T9 and a tenth transistor T10; a second end of the ninth transistor T9 is configured to receive to-be-written data, a first end of the ninth transistor T9 is connected to the bit line BL, and a control end of the ninth transistor T9 is connected to the column selection line CSEL. The ninth transistor T9 is configured to pull the voltage of the bit line BL according to the to-be-written data.

A second end of the tenth transistor T10 is configured to receive the to-be-written data, a first end of the tenth transistor T10 is connected to the reference bit line BLB, and a control end of the tenth transistor T10 is connected to the column selection line CSEL. The tenth transistor T10 is configured to pull the voltage of the reference bit line BLB according to the to-be-written data.

The first transistor T1 and the third transistor T3 are P-type transistors, and the second transistor T2 and the fourth transistor T4 are N-type transistors. The ninth transistor and the tenth transistor are N-type transistors, and the eleventh transistor T11 and the twelfth transistor T12 are P-type transistors.

Figure 7:
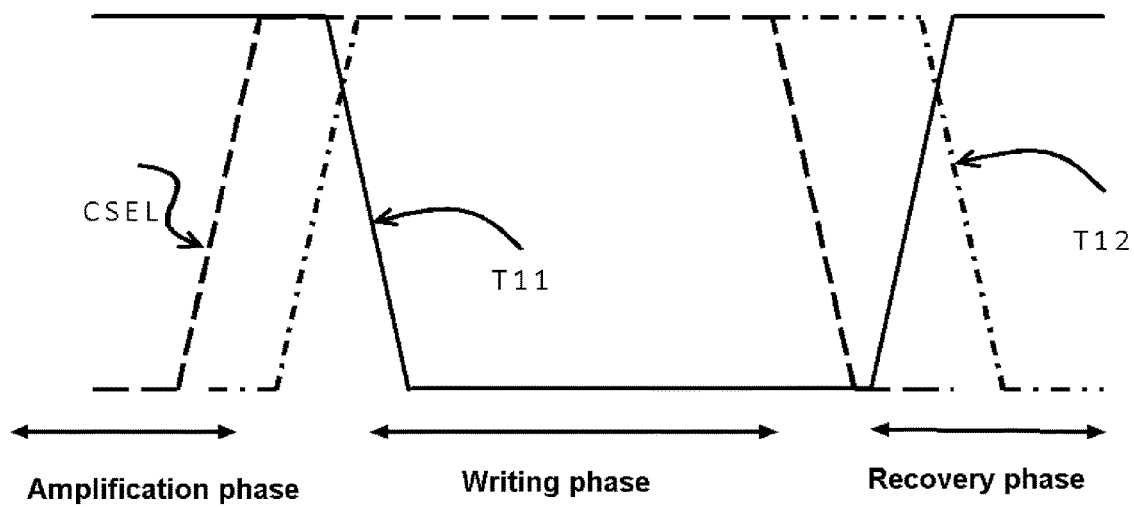
FIG. 7 is a schematic diagram of the relationship between a control signal and a column selection signal provided according to some other embodiments of the present disclosure.
Figure 8:
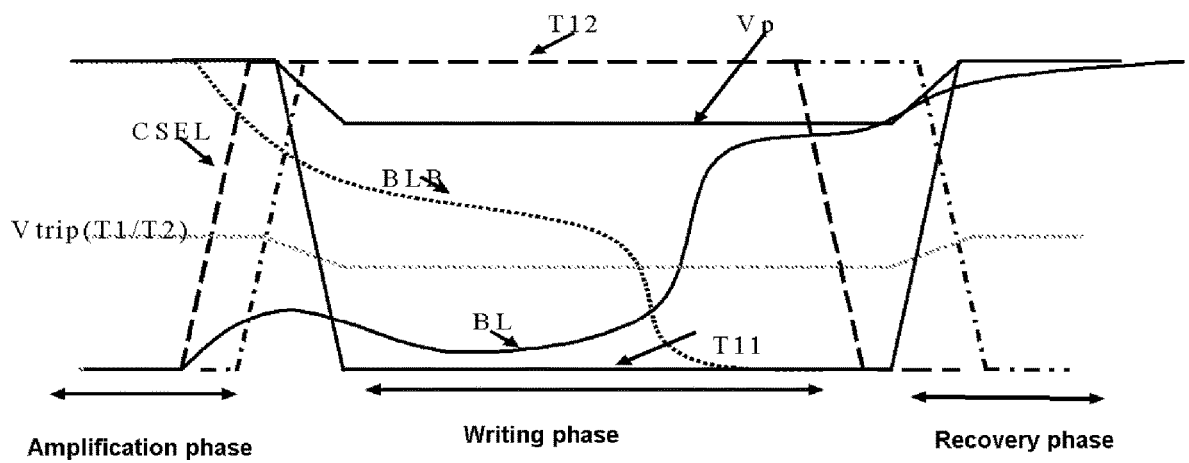
FIG. 8 is a schematic diagram of voltage change of a sense amplifier provided according to some other embodiments of the present disclosure.

Hereinafter, in conjunction with FIGS. 7 and 8, a process in which data is written into the memory cell by the sense amplifier 10 is described.

In a writing phase, the column selection signal is at a high level; and in an amplification phase and a recovery phase, the column selection signal is at a low level.

After the inversion circuit performs inversion processing on the column selection signal, the first control signal is at a low level in the writing phase, and is at a high level in the amplification phase and the recovery phase.

After the buffer circuit performs buffering processing on the column selection signal, the second control signal is at a high level in the writing phase, and the second control signal is at a low level in the amplification phase and the recovery phase.

In a precharge phase, a switch between a charging power supply and the bit line BL and a switch between the charging power supply and the reference bit line BLB is closed, and a voltage of a bit line BL of a first memory array 20 and a voltage of a reference bit line BLB are pulled to a reference voltage by the charging power supply.

In the amplification phase, the first control signal is at a high level, the second control signal is at a low level, the eleventh transistor T11 is opened, the twelfth transistor T12 is closed, and the second power supply end Vcc supplies a second voltage to the amplification module 101. The amplification module 101 has a strong capability of pulling the voltage of the bit line BL and the voltage of the reference bit line BLB, and the voltage of the bit line BL is less than the reference voltage, the amplification module 101 pulls up the voltage of the reference bit line BLB and pulls down the voltage of the bit line BL, so as to amplify a voltage difference between the bit line BL and the reference bit line BLB.

In the writing phase, the first control signal is at a low level, the second control signal is at a high level, the eleventh transistor T11 is closed, the twelfth transistor T12 is opened, and the first power supply end $V_L$ supplies a first voltage to the amplification module 101. The column selection signal is at a high level, when writing data is "1", the ninth transistor T9 is turned on, the tenth transistor T10 is turned on, and the ninth transistor T9 pulls up the voltage of the bit line BL; and when the writing data is "0", the tenth transistor T10 is turned on, the ninth transistor T9 is turned on, and the tenth transistor T10 pulls up the voltage of the reference bit line BLB.

In the recovery phase, the first control signal is at a high level, the second control signal is at a low level, the eleventh transistor T11 is opened, the twelfth transistor T12 is closed, and the second power supply end Vcc supplies the second voltage to the amplification module 101. The amplification module 101 stabilizes the voltages of the bit line BL and the reference bit line BLB at the to-be-written data, the bit line BL also charges a storage capacitor C, and after a certain time of charging, the to-be-written data is written into the storage capacitor C. Then, the access transistor is turned off by controlling a signal in a word line, so as to complete data writing.

In the described process, the first voltage is provided to the amplification module in the writing phase, and after the column selection signal is enabled, the reference bit line BLB is pulled down to an inversion point voltage Vtrip, so as to form positive feedback which inverts the sense amplifier, the to-be-written data can be stably presented on the bit line BL and the reference bit line BLB, so as to achieve successful writing of data in cases where drive capability is weak.

In the described technical solution, control signals of the two switch units are generated according to the column selection signal, so that capability of the amplification module in pulling the voltage of the bit line and the voltage of the reference bit line is weakened in the writing phase, and the capability of the amplification module in pulling the voltage of the bit line and the voltage of the reference bit line is recovered in the recovery phase, such that structure of the control unit is simplified while achieving successful writing of data, thereby improving reliability of the sense amplifier.

Figure 9:
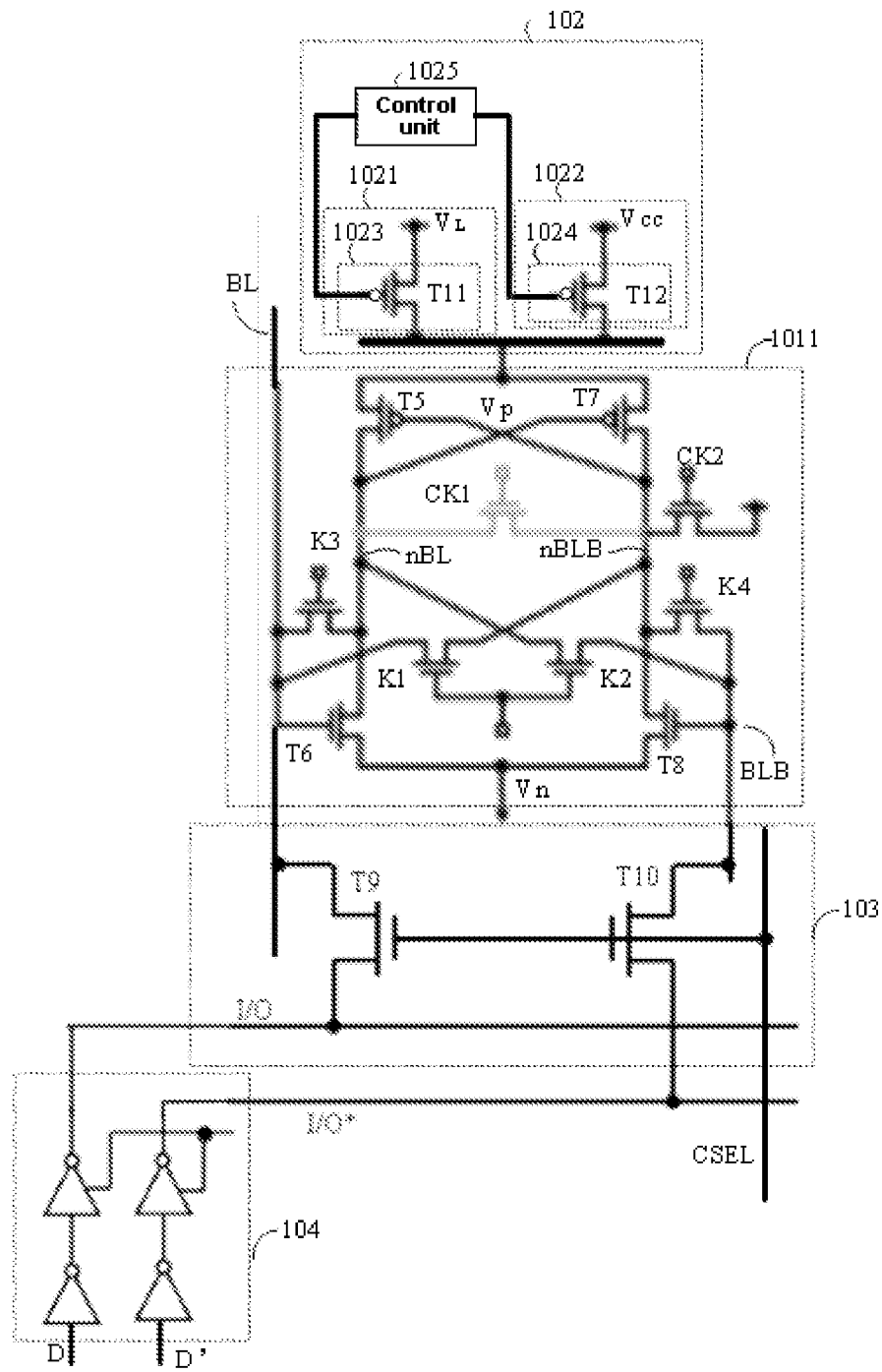
FIG. 9 is a circuit structure diagram of a sense amplifier provided according to some other embodiments of the present disclosure.

As shown in FIG. 9, some other embodiments of the present disclosure provide a sense amplifier 10, the sense amplifier 10 includes an amplification module 101, a controllable power module 102, a writing module 103 and a drive module 104. The amplification module 101 is connected to the controllable power module 102, the writing module 103 is connected to a bit line BL, the writing module 103 is further connected to a reference bit line BLB, and the drive module 104 is connected to the writing module 103.

The amplification module 101 includes at least one cross-coupled amplification circuit 1011, each of the at least one cross-coupled amplification circuit 1011 is provided with a first end Vp, a second end Vn, a third end and a fourth end. The first end Vp of the cross-coupled amplification circuit 1011 is connected to an output end of the controllable power module 102, the second end Vn of the cross-coupled amplification circuit is grounded, the third end of the cross-coupled amplification circuit 1011 is connected to the bit line BL, and the fourth end of the cross-coupled amplification circuit 1011 is connected to the reference bit line BLB.

The cross-coupled amplification circuit 1011 is a single cross-coupled amplification circuit and has a deviation elimination function. The cross-coupled circuit 1011 specifically includes: a fifth transistor T5, a sixth transistor T6, a seventh transistor T7, an eighth transistor T8, a first switch K1, a second switch K2, a third switch K3, and a fourth switch K4.

A first end of the fifth transistor T5 is the first end Vp of the cross-coupled amplification circuit 1011, a second end of the sixth transistor T6 is the second end Vn of the cross-coupled amplification circuit 1011, a second end of the fifth transistor T5 is the third end of the cross-coupled amplification circuit 1011, and a second end of the seventh transistor T7 is the fourth end of the cross-coupled amplification circuit 1011.

The second end of the fifth transistor T5 is connected to a first end of the sixth transistor T6, the second end of the seventh transistor T7 is connected to a first end of the eighth transistor T8, the first end of the fifth transistor T5 is connected to a first end of the seventh transistor T7, and the second end of the sixth transistor T6 is connected to a second end of the eighth transistor T8.

A control end of the fifth transistor T5 is connected to the second end of the seventh transistor T7, a control end of the sixth transistor T6 is connected to the second end of the seventh transistor T7 through the first switch K1, and the control end of the sixth transistor T6 is connected to the first end of the sixth transistor T6 through the third switch K3.

A control end of the seventh transistor T7 is connected to the second end of the fifth transistor T5, a control end of the eighth transistor T8 is connected to the second end of the fifth transistor T5 through the second switch K2, and the control end of the eighth transistor T8 is connected to the first end of the eighth transistor T8 through the fourth switch K4.

The controllable power module 102 includes a first controllable power unit 1021, a second controllable power unit 1022, and a control unit 1025. An output end of the first controllable power unit 1021 is connected to a first end of the amplification module 101, an output end of the second controllable power unit 1022 is also connected to the first end of the amplification module 101, the control unit 1025 is connected to a control end of the first controllable power unit 1021, and the control unit 1025 is also connected to a control end of the second controllable power unit 1022.

The first controllable power unit 1021 includes a first switch unit 1023, and the second controllable power unit 1022 includes a second switch unit 1024. The first switch unit 1023 is an eleventh transistor T11, and the second switch unit 1024 is a twelfth transistor T12.

A first end of the eleventh transistor T11 is connected to a first power supply end $V_L$, a second end of the eleventh transistor T11 is connected to the first end Vp of the cross-coupled circuit 1011, and a control end of the eleventh transistor T11 is connected to the control unit 1025.

A first end of the twelfth transistor T12 is connected to a second power supply end Vcc, a second end of the twelfth transistor T12 is connected to the first end Vp of the cross-coupled circuit 1011, and a control end of the twelfth transistor T12 is connected to an output end of the control unit 1025.

The writing module 103 includes a ninth transistor T9 and a tenth transistor T10; a second end of the ninth transistor T9 is configured to receive to-be-written data, a first end of the ninth transistor T9 is connected to the bit line BL, and a control end of the ninth transistor T9 is connected to a column selection line CSEL. The ninth transistor T9 is configured to pull the voltage of the bit line BL according to the to-be-written data.

A second end of the tenth transistor T10 is configured to receive the to-be-written data, a first end of the tenth transistor T10 is connected to the reference bit line BLB, and a control end of the tenth transistor T10 is connected to the column selection line CSEL. The tenth transistor T10 is configured to pull the voltage of the reference bit line BLB according to the to-be-written data.

The fifth transistor T5, the seventh transistor T7, the eleventh transistor T11 and the twelfth transistor T12 are P-type transistors, and the sixth transistor T6, the eighth transistor T8, the ninth transistor T9 and the tenth transistor T10 are N-type transistors.

The drive module includes two groups of inverters, each group of inverters includes two cascaded inverters, and one group of inverters are connected to the second end of the ninth transistor T9, and the other group of inverters are connected to the second end of the tenth transistor T10, and one group of inverters are configured to receive to-be-written data D, and the other group of inverters are configured to receive inverted to-be-written data D'.

Hereinafter, a process in which data is written into the memory cell 21 by the sense amplifier 10 is described. For convenience of description, a connection line between the second end of the fifth transistor T5 and the first end of the sixth transistor T6 is referred to as an internal bit line nBL of a first memory array 20, and a connection line between the second end of the seventh transistor T7 and the first end of the eighth transistor T8 is referred to as an internal reference bit line nBLB of the first memory array 20.

In an idle phase, the first switch K1 and the second switch K2 are closed, and the third switch K3 and the fourth switch K4 are also closed. The control end of the sixth transistor T6 is connected to the second end of the seventh transistor T7, and the control end of the sixth transistor T6 is connected to the first end of sixth transistor T6. The control end of the eighth transistor T8 is connected to the second end of the fifth transistor T5, and the control end of the eighth transistor T8 is connected to the first end of the eighth transistor T8. Charging switches CK1 and CK2 are closed, so as to charge the internal bit line nBL and the internal reference bit line nBLB through a charging power supply. At this time, in some embodiments, the bit line BL, the reference bit line BLB, the internal bit line nBLB, and the internal reference bit line nBLB are all charged to $0.5V_{CC}$.

In a deviation elimination phase, a first control signal is at a high level, a second control signal is at a low level, the eleventh transistor T11 is opened, the twelfth transistor T12 is closed, and the second power supply end Vcc supplies power to the amplification module 101. The first switch K1 and the second switch K2 are opened, and the third switch K3 and the fourth switch K4 are closed. The first end of the sixth transistor T6 is connected to the control end of the sixth transistor T6, the first end of the eighth transistor T8 is connected to the control end of the eighth transistor T8, and two N-type transistors are both connected by diodes. As two transistors connected by diodes are different in manufacturing, compensation voltages are generated on the bit line BL and the reference bit line BLB, and the compensation voltages can eliminate transistor manufacturing differences (which can be referred to as an offset voltage) between an N-type transistor pair or a P-type transistor pair. For example, the offset voltage is obtained by subtracting the voltage on the reference bit line BLB from the voltage on the bit line BL, or the offset voltage is obtained by subtracting the voltage on the bit line BL from the voltage on the reference bit line BLB.

In a precharge phase, the first switch K1 to the fourth switch K4 are opened. The voltage of the internal bit line nBL and the voltage of the internal reference bit line nBLB of the first memory array 20 are both pulled up to a reference voltage, and the reference voltage is a voltage of a fixed power supply connected to a storage capacitor C. In some embodiments, the voltage of the fixed power supply is $0.5V_{CC}$.

In a writing phase, the first control signal is at a low level, the second control signal is at a high level, the eleventh transistor T11 is closed, the twelfth transistor T12 is opened, and the first power supply end $V_L$ supplies power to the amplification module 101. The first switch K1 to the fourth switch K4 are opened. A column selection signal is at a high level, when writing data is "1", the ninth transistor T9 is turned on, the tenth transistor T10 is turned on, the ninth transistor T9 pulls up the voltage of the bit line BL, and the tenth transistor T10 pulls down the voltage of the reference bit line BLB; and when the writing data is "0", the ninth transistor T9 is turned on, the tenth transistor T10 is turned on, the ninth transistor T9 pulls down the voltage of the bit line BL, and the tenth transistor T10 pulls up the voltage of the reference bit line BLB.

In a recovery phase, the first control signal is at a high level, the second control signal is at a low level, the eleventh transistor T11 is opened, the twelfth transistor T12 is closed, and the second power supply end Vcc supplies power to the amplification module 101. The first switch K1 and the second switch K2 are closed, and the third switch K3 and the fourth switch K4 are opened. Two P-type transistors constitute a cross-coupled inverter, and two N-type transistors constitute a cross-coupled inverter. The amplification module 101 stabilizes the voltages of the bit line BL and the reference bit line BLB at the to-be-written data, the bit line BL also charges the storage capacitor C, and after a certain time of charging, the to-be-written data is written to the storage capacitor C. Then, an access transistor is turned off by controlling a signal in a word line, so as to complete data writing.

In the described technical solution, the control unit controls the closing or opening of the two switch units, so as to control a power supply end supplying power to the amplification module; the first power supply end supplies the first voltage to the amplification module in the writing phase, so as to weaken capability of the amplification module in pulling the voltage of the bit line and the voltage of the reference bit line, thereby ensuring that the voltage of the bit line and the voltage of the reference bit line can also be pulled according to the to-be-written data when drive capability of the writing module is weak, so as to write the to-be-written data into the memory cell.

Figure 10:
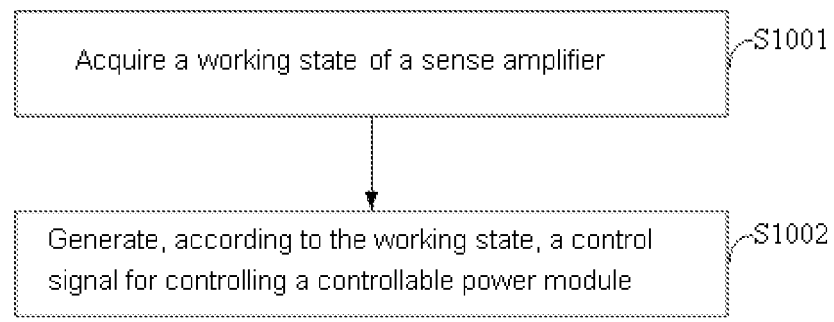
FIG. 10 is a schematic diagram of a flowchart of controlling amplification of a sense amplifier provided according to some other embodiments of the present disclosure.

As shown in FIG. 10, some embodiments of the present disclosure provide a control method for a sense amplifier 10. The structure of the sense amplifier has been described in detail in the embodiments above, and will not be repeated herein. The control method includes:

S1001: a working state of the sense amplifier is acquired, and the working state includes a writing phase and a non-writing phase, the non-writing phase includes a recovery phase, and in some embodiments, the non-writing phase also includes an access phase and/or an amplification phase; and S1002: a control signal for controlling a controllable power module is generated according to the working state, and in the writing phase, a control signal for controlling the controllable power module to supply a first voltage to an amplification module is generated, so as to weaken drive capability of the amplification module in the writing phase, at this time, a writing module pulls a voltage of a bit line and a voltage of a reference bit line according to to-be-written data; and in the non-writing phase, a control signal for controlling the controllable power module to supply a second voltage to the amplification module is generated, and capability of the amplification module in pulling the voltage of the bit line and the voltage of the reference bit line is recovered, so that the amplification module stabilizes the voltages of the bit line and the reference bit line at the to-be-written data in the recovery phase, the bit line also charges a storage capacitor, and after a certain time of charging, the to-be-written data is written into the storage capacitor.

In other embodiments, the controllable power module includes a first controllable power unit 1021 and a second controllable power unit 1022. The first controllable power unit 1021 includes a first switch unit 1023, and the second controllable power unit 1022 includes a second switch unit 1024. The first switch unit 1023 is an eleventh transistor T11, and the second switch unit 1024 is a twelfth transistor T12.

A first end of the eleventh transistor T11 is connected to a first power supply end $V_L$, a second end of the eleventh transistor T11 is connected to a first end Vp of a cross-coupled circuit 1011, and a control end of the eleventh transistor T11 is connected to a control module 1025. A first end of the twelfth transistor T12 is connected to a second power supply end Vcc, a second end of the twelfth transistor T12 is connected to the first end Vp of the cross-coupled circuit 1011, and a control end of the twelfth transistor T12 is connected to an output end of the control module 1025.

A control signal for controlling the controllable power module is generated according to a column selection signal, such that the eleventh transistor is closed in the writing phase, and the first voltage is supplied to the amplification module, and the twelfth transistor is closed in the non-writing phase, and the second voltage is supplied to the amplification module.

In the described technical solution, the first voltage is provided by the controllable power module to the amplification module in the writing phase, and the capability of the amplification module in pulling the voltage of the bit line and the voltage of the reference bit line is weakened, at this time, the writing module pulls the voltage of the bit line and the voltage of the reference bit line according to the to-be-written data, so that the to-be-written data can also be successfully presented on the bit line and the reference bit line in cases where the drive capability of the writing module is weak, and then the data can be successfully written into a memory cell.

Finally, it should be noted that the described embodiments are only used to explain the technical solutions of the present disclosure, rather than limit same. Although some embodiments of the present disclosure have been explained in detail with reference to the described embodiments, a person of ordinary skill in the art would have understood that they still could modify the technical solutions disclosed in the described embodiments or make equivalent replacements to some or all of the technical features therein. However, these modifications or replacements shall not render that the nature of the corresponding technical solutions departs from the technical solutions of the embodiments.

What is claimed is:

1. A sense amplifier, comprising:
    an amplification module, configured to amplify a voltage difference between a bit line and a reference bit line when the sense amplifier is in an amplification phase;
    a controllable power module, connected to the amplification module and configured to supply a first voltage to the amplification module when the sense amplifier is in a writing phase, and supply a second voltage to the amplification module when the sense amplifier is in a non-writing phase, wherein the second voltage is greater than the first voltage; and
    a writing module, connected to the bit line and the reference bit line, and configured to pull the voltage difference between the bit line and the reference bit line according to to-be-written data when the sense amplifier is in the writing phase.

2. The sense amplifier according to claim 1, wherein the controllable power module comprises:
    a first controllable power unit, connected to a first end of the amplification module, and configured to supply the first voltage to the amplification module;
    a second controllable power unit, connected to the first end of the amplification module and configured to supply the second voltage to the amplification module; and
    a control unit, connected to the first controllable power unit, and further connected to the second controllable power unit, and configured to control the first controllable power unit to supply the first voltage to the amplification module during the writing phase, and further configured to control the second controllable power unit to supply the second voltage to the amplification module during the non-writing phase.

3. The sense amplifier according to claim 2, wherein the first controllable power unit comprises:
    a first switch unit, provided with a first end, a second end and a control end, wherein the first end of the first switch unit is connected to a first power supply end, the second end of the first switch unit is connected to the first end of the amplification module, and the control end of the first switch unit is connected to a first output end of the control unit.

4. The sense amplifier according to claim 3, wherein the second controllable power circuit comprises:
    a second switch unit, provided with a first end, a second end and a control end, wherein the first end of the second switch unit is connected to a second power supply end, the second end of the second switch unit is connected to the first end of the amplification module, and the control end of the second switch unit is connected to a second output end of the control unit, and a power supply voltage of the first power supply end is less than a power supply voltage of the second power supply end.

5. The sense amplifier according to claim 4, wherein the first switch unit and the second switch unit are P-type transistors.

6. The sense amplifier according to claim 5, wherein the control unit comprises:
    an inversion circuit, comprising an input end and an output end, wherein the input end of the inversion circuit is connected to a column selection line, and the output end of the inversion circuit is connected to the control end of the first switch unit, and configured to perform inversion processing on a column selection signal and then obtain a first control signal for controlling the first switch unit; and
    a buffer circuit, comprising an input end and an output end, wherein the input end of the buffer circuit is connected to the column selection line, and the output end of the buffer circuit is connected to the control end of the second switch unit, and configured to perform buffer processing on the column selection signal and then obtain a second control signal for controlling the second switch unit.

7. The sense amplifier according to claim 1, wherein the amplification module comprises:
    at least one cross-coupled amplification circuit, each of the at least one cross-coupled amplification circuit provided with a first end, a second end, a third end and a fourth end;
    the first end of the cross-coupled amplification circuit is connected to an output end of a first controllable power unit, the first end of the cross-coupled amplification circuit is further connected to an output end of the second controllable power unit, the second end of the cross-coupled amplification circuit is grounded, the third end of the cross-coupled amplification circuit is connected to the bit line, and the fourth end of the cross-coupled amplification circuit is connected to the reference bit line.

8. The sense amplifier according to claim 7, wherein the cross-coupled amplification circuit comprises: a first transistor, a second transistor, a third transistor and a fourth transistor;
    a first end of the first transistor is the first end of the cross-coupled amplification circuit, a second end of the second transistor is the second end of the cross-coupled amplification circuit, a second end of the first transistor is the third end of the cross-coupled amplification circuit, and a second end of the third transistor is the fourth end of the cross-coupled amplification circuit;

the second end of the first transistor is connected to a first end of the second transistor, the second end of the third transistor is connected to a first end of the fourth transistor, the first end of the first transistor is connected to a first end of the third transistor, and the second end of the second transistor is connected to a second end of the fourth transistor;

a control end of the first transistor is connected to the second end of the third transistor, and a control end of the second transistor is connected to the second end of the third transistor; and a control end of the third transistor is connected to the second end of the first transistor, and a control end of the fourth transistor is connected to the second end of the first transistor.

9. The sense amplifier according to claim 7, wherein the cross-coupled amplification circuit comprises: a fifth transistor, a sixth transistor, a seventh transistor, an eighth transistor, a first switch, a second switch, a third switch and a fourth switch;

a first end of the fifth transistor is the first end of the cross-coupled amplification circuit, a second end of the sixth transistor is the second end of the cross-coupled amplification circuit, a second end of the fifth transistor is the third end of the cross-coupled amplification circuit, and a second end of the seventh transistor is the fourth end of the cross-coupled amplification circuit;

the second end of the fifth transistor is connected to a first end of the sixth transistor, the second end of the seventh transistor is connected to a first end of the eighth transistor, the first end of the fifth transistor is connected to a first end of the seventh transistor, and the second end of the sixth transistor is connected to a second end of the eighth transistor;

a control end of the fifth transistor is connected to the second end of the seventh transistor, a control end of the sixth transistor is connected to the second end of the seventh transistor through the first switch, and the control end of the sixth transistor is connected to the first end of the sixth transistor through the third switch; and a control end of the seventh transistor is connected to the second end of the fifth transistor, a control end of the eighth transistor is connected to the second end of the fifth transistor through the second switch, and the control end of the eighth transistor is connected to the first end of the eighth transistor through the fourth switch.

10. The sense amplifier according to claim 8, wherein the writing module comprises:

a ninth transistor, comprising a first end, a second end and a control end, wherein the second end of the ninth transistor is configured to receive the to-be-written data, a first end of the ninth transistor is connected to the bit line, and a control end of the ninth transistor is connected to a column selection line, and the ninth transistor is configured to pull a voltage of the bit line according to the to-be-written data;

a tenth transistor, comprising a first end, a second end and a control end, wherein the second end of the tenth transistor is configured to receive the to-be-written data, the first end of the tenth transistor is connected to the reference bit line, and a control end of the tenth transistor is connected to the column selection line, and the tenth transistor is configured to pull a voltage of the reference bit line according to the to-be-written data.

11. The sense amplifier according to claim 10, wherein the first transistor and the third transistor are P-type transistors, and the second transistor, the fourth transistor, the ninth transistor and the tenth transistor are N-type transistors.

12. The sense amplifier according to claim 10, wherein the fifth transistor and the seventh transistor are P-type transistors, and the sixth transistor, the eighth transistor, the ninth transistor and the tenth transistor are N-type transistors.

13. The sense amplifier according to claim 1, wherein the sense amplifier comprises:

a drive module, connected to the writing module, and configured to perform enhancement processing on the to-be-written data.

14. A memory, comprising a sense amplifier, and memory cells;

wherein a plurality of memory cells constitute a first memory array, a plurality of memory cells constitute a second memory array, the sense amplifier is located between the first memory array and the second memory array, a third end of the sense amplifier is connected to a bit line of the first memory array, and a fourth end of the sense amplifier is connected to a bit line of the second memory array, wherein the sense amplifier comprises:

an amplification module, configured to amplify a voltage difference between a bit line and a reference bit line when the sense amplifier is in an amplification phase;

a controllable power module, connected to the amplification module and configured to supply a first voltage to the amplification module when the sense amplifier is in a writing phase, and supply a second voltage to the amplification module when the sense amplifier is in a non-writing phase, wherein the second voltage is greater than the first voltage; and a writing module, connected to the bit line and the reference bit line, and configured to pull the voltage difference between the bit line and the reference bit line according to to-be-written data when the sense amplifier is in the writing phase.

15. A control method for a sense amplifier, the sense amplifier comprising an amplification module, a controllable power module, and a writing module, the method comprising:

acquiring a working state of the amplification module, wherein the working state comprises a writing phase and a non-writing phase; and generating, according to the working state, a control signal for controlling the controllable power module, so that the controllable power module supplies a first voltage to the amplification module in the writing phase, and supplies a second voltage to the amplification module in the non-writing phase, wherein the second voltage is higher than the first voltage.

16. The method according to claim 15, wherein generating, according to the working state, the control signal for controlling the controllable power module specifically comprises:

generating, according to a column selection signal, the control signal for controlling the controllable power module.

17. The sense amplifier according to claim 9, wherein the writing module comprises:

a ninth transistor, comprising a first end, a second end and a control end, wherein the second end of the ninth transistor is configured to receive the to-be-written data, a first end of the ninth transistor is connected to the bit line, and a control end of the ninth transistor is connected to a column selection line, and the ninth transistor is configured to pull a voltage of the bit line according to the to-be-written data;

a tenth transistor, comprising a first end, a second end and a control end, wherein the second end of the tenth transistor is configured to receive the to-be-written data, the first end of the tenth transistor is connected to the reference bit line, and a control end of the tenth transistor is connected to the column selection line, and the tenth transistor is configured to pull a voltage of the reference bit line according to the to-be-written data.

18. The memory according to claim 14, wherein the controllable power module comprises:

a first controllable power unit, connected to a first end of the amplification module, and configured to supply the first voltage to the amplification module;

a second controllable power unit, connected to the first end of the amplification module and configured to supply the second voltage to the amplification module; and a control unit, connected to the first controllable power unit, and further connected to the second controllable power unit, and configured to control the first controllable power unit to supply the first voltage to the amplification module during the writing phase, and further configured to control the second controllable power unit to supply the second voltage to the amplification module during the non-writing phase.

19. The memory according to claim 18, wherein the first controllable power unit comprises:

a first switch unit, provided with a first end, a second end and a control end, wherein the first end of the first switch unit is connected to a first power supply end, the second end of the first switch unit is connected to the first end of the amplification module, and the control end of the first switch unit is connected to a first output end of the control unit.

20. The memory according to claim 19, wherein the second controllable power circuit comprises:

a second switch unit, provided with a first end, a second end and a control end, wherein the first end of the second switch unit is connected to a second power supply end, the second end of the second switch unit is connected to the first end of the amplification module, and the control end of the second switch unit is connected to a second output end of the control unit, and a power supply voltage of the first power supply end is less than a power supply voltage of the second power supply end.

* * * * *